(12) United States Patent
Lee et al.

(10) Patent No.: US 8,324,085 B2
(45) Date of Patent: Dec. 4, 2012

(54) METHOD OF MANUFACTURING CRYSTALLINE SILICON

(75) Inventors: Jung-hyun Lee, Suwon-si (KR); Dong-joon Ma, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 353 days.

(21) Appl. No.: 12/588,609

(22) Filed: Oct. 21, 2009

(65) Prior Publication Data

US 2010/0144129 A1    Jun. 10, 2010

(30) Foreign Application Priority Data

Dec. 8, 2008 (KR) .................. 10-2008-0124288

(51) Int. Cl.
H01L 21/20 (2006.01)
H01L 21/36 (2006.01)
H01L 21/26 (2006.01)
H01L 21/31 (2006.01)
H01L 21/469 (2006.01)

(52) U.S. Cl. ......... 438/478; 438/488; 438/758; 438/513

(58) Field of Classification Search .................. 438/478, 438/488, 486, 491, 492, 493, 497, 503, 502, 438/509, 485, 487, 513, 517, 694, 758, 788, 438/792, 798
See application file for complete search history.

(56) References Cited

U.S. PATENT DOCUMENTS

| 7,410,913 | B2 * | 8/2008 | Lee et al. ................. 438/778 |
| 7,942,111 | B2 * | 5/2011 | Burger et al. ............ 118/723 R |
| 2010/0304521 | A1 * | 12/2010 | Seutter et al. ............... 438/71 |

FOREIGN PATENT DOCUMENTS

| JP | 10-340855 | 12/1998 |
| KR | 10-2000-0031708 | 6/2000 |
| KR | 10-2000-0031709 | 6/2000 |
| KR | 10-2000-0066907 | 11/2000 |
| KR | 10-2002-0013635 | 2/2002 |
| KR | 10-2002-0089959 | 11/2002 |
| KR | 10-2003-0008752 | 1/2003 |
| KR | 10-2004-0051075 | 6/2004 |
| KR | 10-2005-0039023 | 4/2005 |
| KR | 10-2006-0010563 | 2/2006 |

\* cited by examiner

*Primary Examiner* — Chuong A. Luu
(74) *Attorney, Agent, or Firm* — Harness, Dickey & Pierce, P.L.C.

(57) ABSTRACT

Disclosed is a method of manufacturing crystalline Si by using plasma. According to the disclosed method, silicon (Si) deposition and reduction processes using plasma are cyclically performed in order to completely remove an a-Si layer so as to form crystalline Si on a substrate early in the process.

8 Claims, 7 Drawing Sheets

METHOD OF MANUFACTURING CRYSTALLINE SILICON

CROSS-REFERENCE TO RELATED APPLICATIONS

This application claims priority under 35 USC §119 to Korean Patent Application No. 10-2008-0124288, filed on Dec. 8, 2008, the entire contents of which are incorporated herein by reference.

BACKGROUND

1. Field

Example embodiments relate to a method of manufacturing crystalline silicon (Si), and more particularly, to a method of manufacturing crystalline Si using a plasma process.

2. Description of the Related Art

A representative method of growing crystalline silicon (Si) includes a capacitive coupled plasma (CCP) method using a showerhead or a hot-wire chemical vapor deposition (CVD) method using a metal material, e.g., tungsten (W).

The CCP method corresponds to a plasma process for applying a radio frequency (RF) bias to a showerhead and performing deposition by diluting an Si material, e.g., $SiH_4$, in an environment having a relatively large amount of $H_2$. The hot-wire CVD method is a method of supplying a current to a metal wire, e.g., a W wire, and performing deposition by decomposing a reaction/material gas, e.g., $SiH_4$, due to catalysis of W at high temperatures.

In the hot-wire CVD method, due to the temperature of a metal wire separated from a substrate, deposition is performed regardless of the temperature of the substrate, and thus, low deposition temperature may be induced. However, because a process reproducibility problem and a cleaning problem occur due to the accumulation of an impurity, e.g., Si, deposited on the metal wire itself, the hot-wire CVD method may not be easily applied to a mass production process.

Currently, a plasma method of applying an RF bias to a showerhead and diluting an Si material, e.g., $SiH_4$, is used in the mass production process. However, the existing plasma method may not easily achieve crystalline characteristics of Si due to an amorphous Si (a-Si) layer formed in an early deposition process due to an Si thin film being actually deposited on an oxide or nitride film that is mostly amorphous. Therefore, early Si nucleation may not be performed easily, the mobility of Si nuclei is reduced, and thus, a stable lattice structure may not be formed easily. In general, crystallization is performed and crystalline Si is obtained after an amorphous portion greater than about 1000 Å is formed. Thus, because a double layer of a-Si/crystalline Si is formed in most cases, a crystalline Si layer is not formed to a desired thickness at high speed and improved mobility and a low defect density may not be easily achieved.

SUMMARY

Example embodiments include a method of manufacturing crystalline silicon (Si), capable of obtaining the crystalline Si early by improving a plasma process so as not to form an amorphous Si (a-Si) layer in an early deposition process. Additional aspects will be set forth in part in the description which follows and, in part, will be apparent from the description, or may be learned by practice of example embodiments.

According to example embodiments, a method of manufacturing crystalline silicon (Si) on a substrate may include cyclically performing Si deposition and reduction processes using plasma in order to completely remove an a-Si layer.

The reduction process may be performed in a gas atmosphere including at least one of $H_2$, $D_2$, and $N_2$. An Si material used in the Si deposition process may include at least one of $H_2$, $D_2$, and $N_2$. The Si deposition process may be performed in an Si material gas atmosphere including at least one of $H_2$, $D_2$, and $N_2$. The reduction process may be performed by increasing a ratio of a reduction gas to an Si material in comparison to the Si deposition process.

A radio frequency (RF) bias may be applied to the substrate in the reduction process. The RF bias may be applied only in the reduction process in a pulse type. An RF range of the RF bias may be from about 27 MHz to about 100 MHz.

According to the above-described method, if deposition and reduction processes using plasma are cyclically performed, incomplete bonding in an early nucleation state, e.g., a-Si nuclei in an adsorption state of H-rich species of Si—H or a weak bonding state, may be removed. Thus, crystalline Si may be formed early.

Accordingly, improved mobility and a low defect density may be achieved and, because crystalline Si may be formed early, a crystalline Si layer may be formed to a desired thickness at high speed. Furthermore, a device including a crystalline Si layer having improved characteristics may be obtained.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
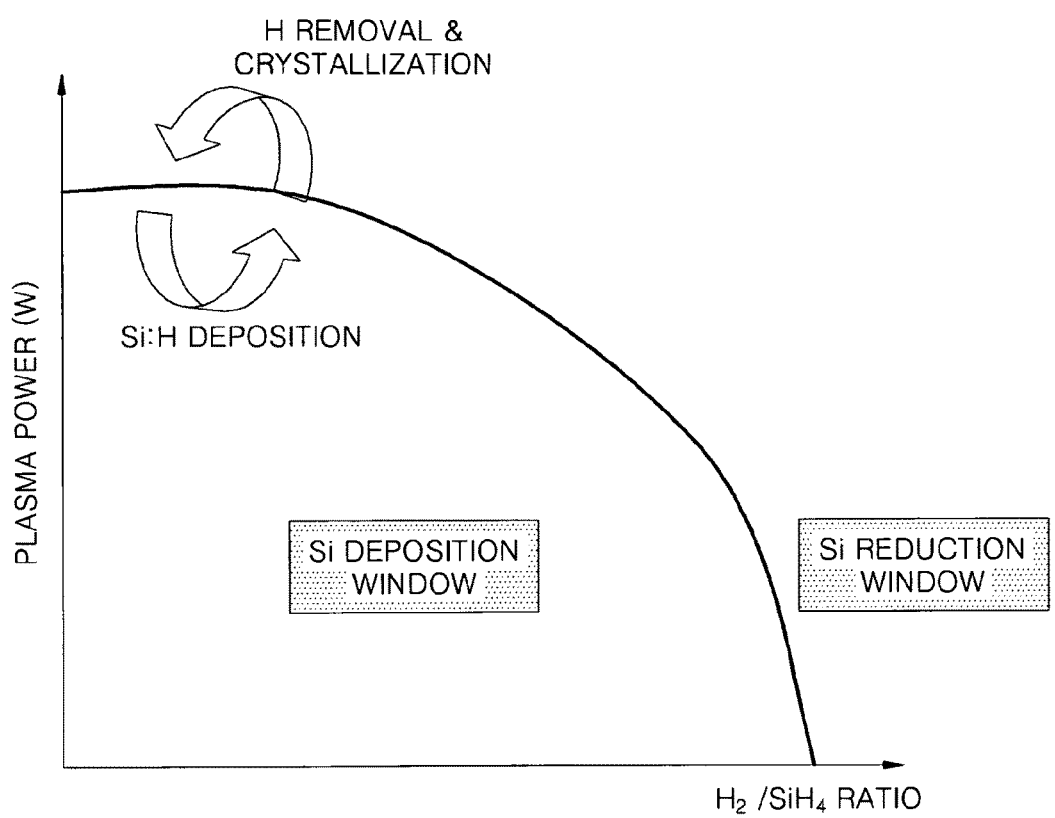
FIG. 1 is a graph showing silicon (Si) thin film deposition characteristics according to a $H_2$:$SiH_4$ ratio.

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a method of manufacturing crystalline silicon (Si) according to example embodiments, Si deposition and reduction processes using plasma are cyclically performed so as to form the crystalline Si on a substrate relatively early. In example embodiments, the reduction process may be performed in a gas atmosphere containing at least one of $H_2$, $D_2$, and $N_2$. Also, an Si material used in the deposition process may contain at least one of $H_2$, $D_2$, and $N_2$.

FIG. 1 is a graph showing Si thin film deposition characteristics according to a $H_2$:$SiH_4$ ratio. In FIG. 1, a horizontal axis represents the $H_2$:$SiH_4$ ratio and a vertical axis represents plasma power (unit: W). Referring to FIG. 1, crystalline Si may be deposited only in a diluted state in which the $H_2$:$SiH_4$ ratio is equal to or less than a ratio, e.g., about 10:1, and Si reduction may occur if the amount of $H_2$ is greater than the ratio.

Accordingly, if a plasma process is performed in an H-rich state, incomplete bonding in an early nucleation state, e.g., amorphous Si (a-Si) nuclei in an adsorption state of H-rich species of Si—H or a weak bonding state, may be removed. Thus, an early amorphous portion may be removed and the crystalline Si may be formed relatively early in the process.

In a method of manufacturing crystalline Si using a plasma process, according to example embodiments, an Si deposition process for diluting an Si material containing at least one of $H_2$, $D_2$, and $N_2$ in an environment containing a relatively large amount of at least one of $H_2$, $D_2$, and $N_2$ (e.g., diluting an Si material, for example, $SiH_4$, in an environment having a relatively large amount of $H_2$), generating plasma, and performing deposition, and a reduction process for forming a reduction gas element-rich state (e.g., an H-rich state if the reduction gas is $H_2$) by increasing the amount of a reduction gas, or blocking the Si material, e.g., $SiH_4$, and supplying only the reduction gas so as to switch from a deposition mode to a reduction mode, generating plasma, and performing reduction, are cyclically repeated, and thus, the crystalline Si may be formed relatively early in the process. In example embodiments, the reduction gas may be at least one of $H_2$, $D_2$, and $N_2$. The reduction process may be performed by increasing the ratio of the reduction gas to the Si material in comparison to the Si deposition process.

Figure 2:
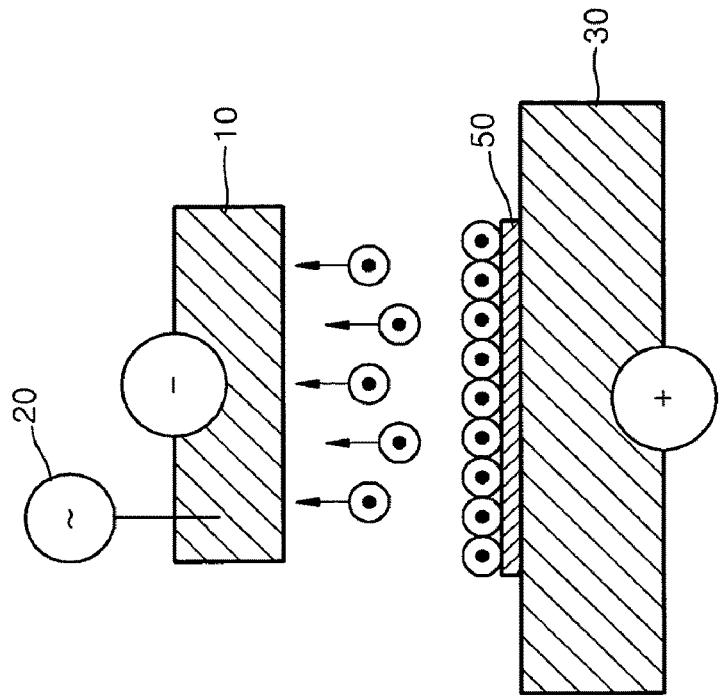
FIGS. 2 and 3 are a cross-sectional diagram and a graph for describing a plasma method according to example embodiments.
Figure 2:
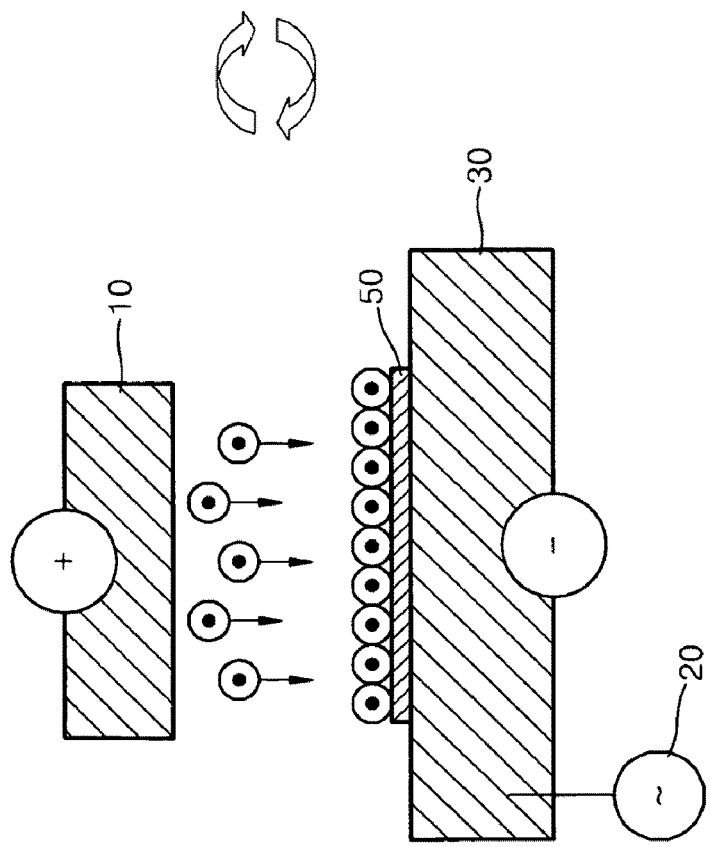
Figure 3:
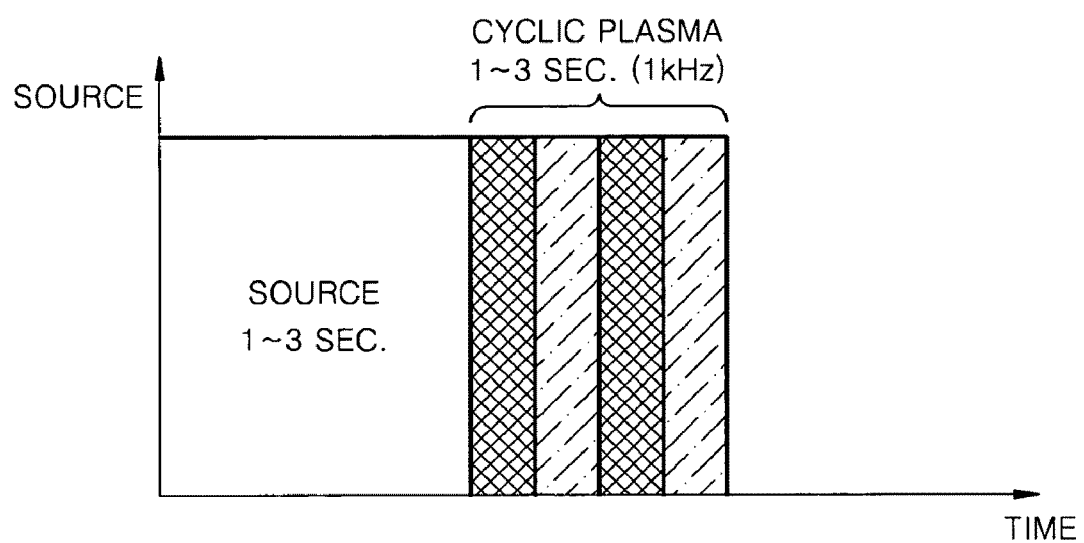

FIGS. 2 and 3 are respectively a cross-sectional diagram and a graph for describing a plasma method according to example embodiments. Referring to FIGS. 2 and 3, an Si deposition process is performed by supplying a source, e.g., an Si material, for example, $SiH_4$, which is diluted in an environment having a relatively large amount of a reduction gas, e.g., $H_2$, for a period of time and generating plasma by applying a radio frequency (RF) bias to a showerhead 10. Then, an Si reduction process may be performed by forming a reduction gas element-rich environment, e.g., an H-rich environment, for a period of time and generating plasma by applying an RF bias to a substrate 30 or the showerhead 10. The Si deposition and reduction processes using plasma are cyclically repeated.

In more detail, as illustrated in a left portion of FIG. 2 and as in a source region illustrated in FIG. 3, like a general CPP method, Si is deposited on the substrate 30 by decomposing the Si material, e.g., $SiH_4$, which is diluted in, for example, an $H_2$ environment, by using plasma for a period of time. Then, as illustrated in a right portion of FIG. 2 and as in a cyclic plasma region illustrated in FIG. 3, a deposition mode may be switched to a reduction mode by forming an H-rich environment. The reduction mode may be realized by generating plasma while blocking the Si material, e.g., $SiH_4$, and supplying only $H_2$, or supplying $H_2$ sufficiently to perform reduction during the supply of the Si material, e.g., $SiH_4$. The Si material, e.g., $SiH_4$, which is diluted in the $H_2$ environment, may be decomposed and may be deposited by using plasma, and the deposition mode may be switched into the reduction mode by forming the H-rich environment. However, a crystalline Si manufacturing method according to example embodiments is not limited thereto. As described above with reference to FIG. 1, the Si material used in the Si deposition process may contain at least one of elements $H_2$, $D_2$, and $N_2$ and at least one of $H_2$, $D_2$, and $N_2$ may be used as the reduction gas.

If the deposition mode and the reduction mode are cyclically repeated, a non-reacted Si adsorbent may be volatilized and removed in a reduction process, a-Si layer may be completely removed from the earlier formed Si, and thus, crystalline Si may be formed relatively early in the process. In FIG. 2, a reference numeral 50 represents an Si layer that is being formed and a reference numeral 20 represents a power source for applying an RF bias.

FIG. 2 illustrates an example where the RF bias is applied to the showerhead 10 in a deposition process and is applied to the substrate 30 in a reduction process. The RF bias may also be applied to the showerhead 10 in the reduction process. The RF bias may be applied only in the reduction process as a pulse type. An RF range of the RF bias applied in the reduction process may be from about 27 MHz to about 100 MHz. FIG. 3 illustrates an example where a source for deposition is initially supplied for about 1 to about 3 sec. and a reduction plasma process is repeated for about 1 to about 3 sec. in a cycle of about 1 kHz.

Figure 4A:
FIGS. 4A and 4B are microscopic images showing variations in surface morphology when a plasma process according to example embodiments is performed.
Figure 4B:
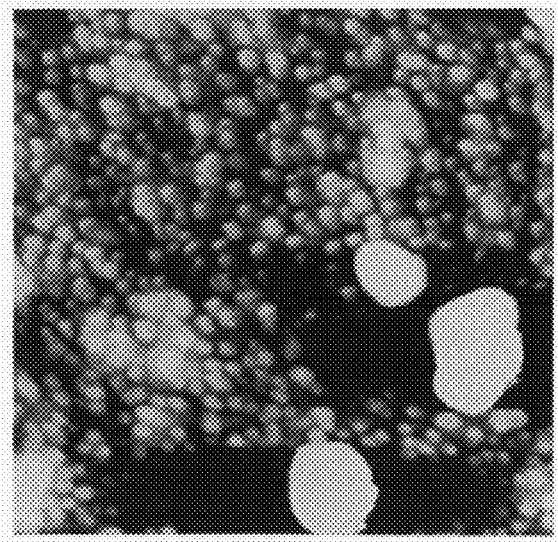

FIGS. 4A and 4B are microscopic images showing variations in surface morphology when a method of manufacturing crystalline Si using a plasma process, according to example embodiments, is performed. FIGS. 4A and 4B shows results obtained when SiH$_4$/H$_2$=3 in a deposition process and only H$_2$ is supplied in a reduction process. FIG. 4A shows surface morphology obtained by performing a cyclic plasma process of 1 sec. deposition and 0.5 sec. reduction and FIG. 4B shows surface morphology obtained by performing a cyclic plasma process of 1 sec. deposition and 1 sec. reduction.

In FIG. 4A, because a reduction time is relatively short, Si crystal nuclei are not clearly shown. However, as in FIG. 4B, if the reduction time is longer, an Si adsorbent is volatilized and is removed due to the reduction process, and thus, early nucleation is selectively performed on a surface. Referring to FIGS. 4A and 4B, desired Si crystal nuclei may not be easily formed if a reduction time is excessively short and may be formed only if reduction is performed for an appropriate period of time. Thus, if the cyclic plasma process of a deposition mode and a reduction mode is performed so that reduction is performed for an appropriate period of time, Si crystal nuclei may be formed.

Figure 5:
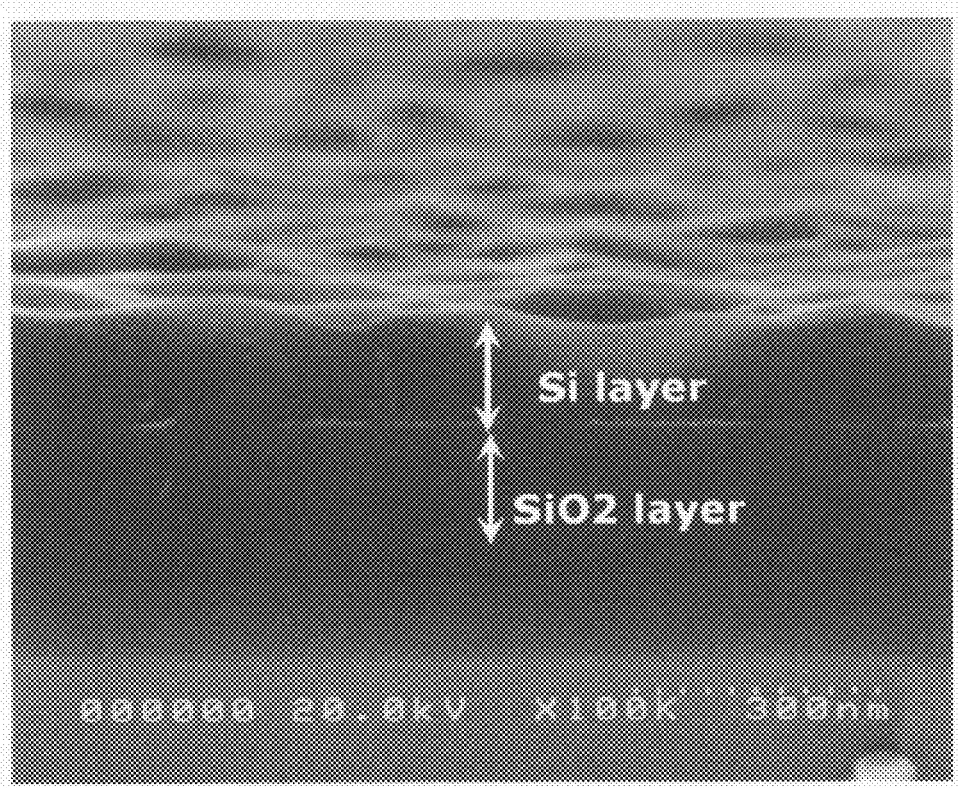
FIGS. 5 and 6 are a microscopic cross-sectional image and a crystallinity graph of an Si layer formed by performing a cyclic plasma process of 1 sec. deposition and 1 sec. reduction.
Figure 6:
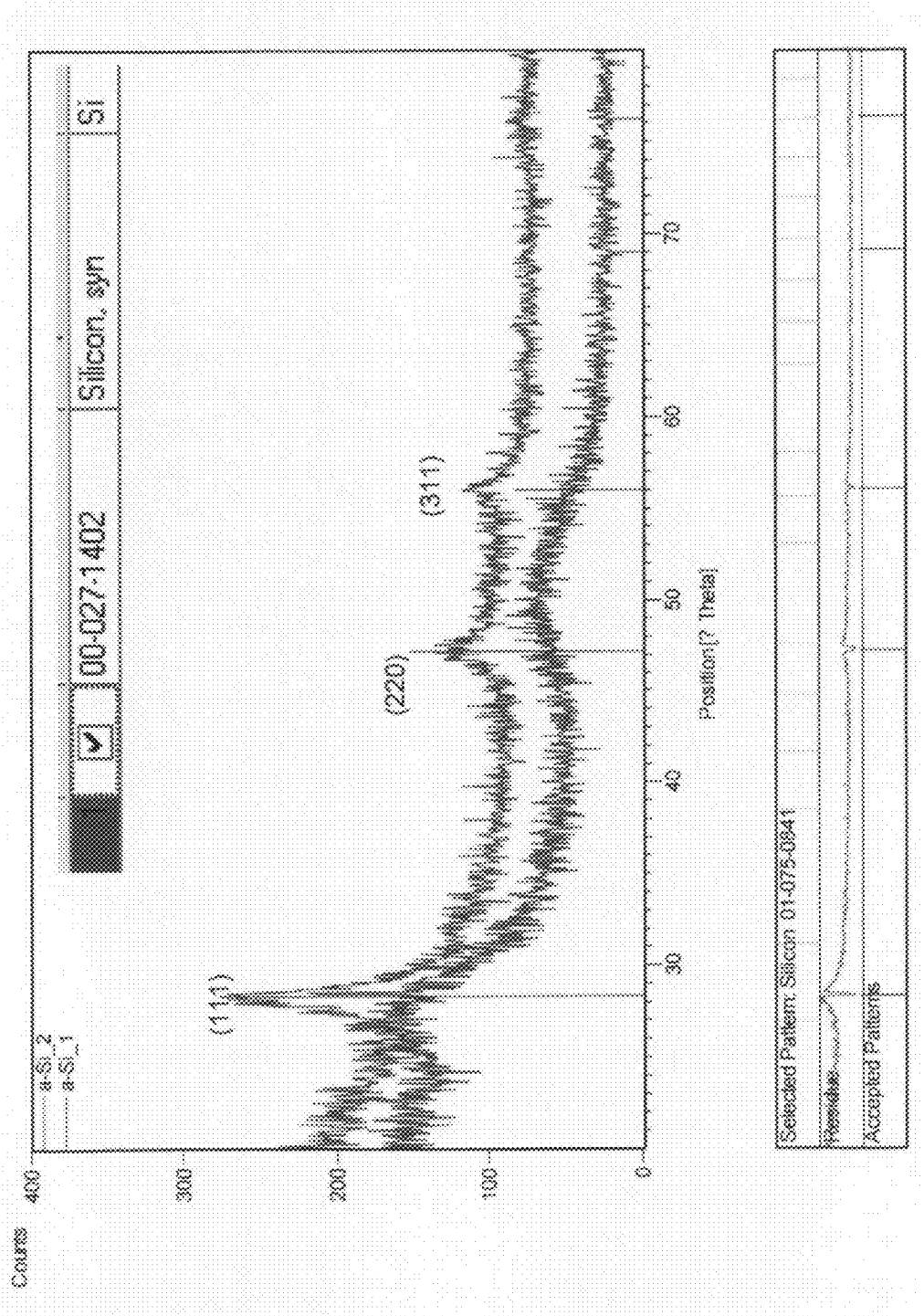

FIGS. 5 and 6 are respectively a microscopic cross-sectional image and an x-ray diffraction (XRD) crystallinity graph of an Si layer formed by performing a cyclic plasma process of 1 sec. deposition and 1 sec. reduction.

Referring to FIG. 5, an early a-Si layer may be completely removed and early crystallization of the Si layer may be ensured. FIG. 5 proves that, if a crystalline Si manufacturing method according to example embodiments is used, a-Si is completely removed from an early Si layer and clean crystalline Si may be formed without an undesired a-Si layer. Referring to FIG. 6, a peak 111 proves that the Si layer formed by using a crystalline Si manufacturing method according to example embodiments is crystallized.

Figure 7:
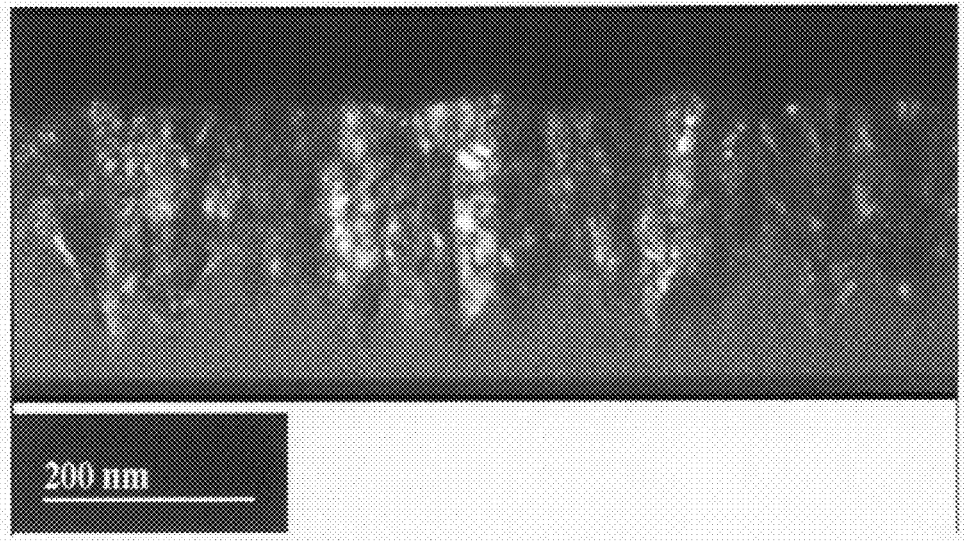
FIG. 7 is a microscopic cross-sectional image of an Si layer formed by using a general CCP method, as a comparative example.

FIG. 7 is a microscopic cross-sectional image of an Si layer formed by using a general CCP method, as a comparative example. Referring to FIGS. 5 and 7, unlike a crystalline Si manufacturing method according to example embodiments, an early Si layer according to the general CCP method is in an amorphous state.

The crystalline Si manufacturing method according to example embodiments may be used to manufacture various devices using a crystalline Si layer. For example, the crystalline Si manufacturing method according to example embodiments may be used to form a crystalline Si layer of a tandem solar battery or a channel layer of a thin-film transistor (TFT) used in a high-speed high-resolution display device, e.g., an organic light emitting diode (OLED)

It should be understood that example embodiments described herein should be considered in a descriptive sense only and not for purposes of limitation. Descriptions of features or aspects within each embodiment should typically be considered as available for other similar features or aspects in other example embodiments.

What is claimed is:

1. A method of manufacturing crystalline silicon (Si) on a substrate comprising:
cyclically performing Si deposition and reduction processes using plasma in order to completely remove an a-Si layer,
wherein the reduction process is performed by increasing a ratio of a reduction gas to an Si material in comparison to the Si deposition process.

2. The method of claim 1, wherein the reduction gas includes at least one of H$_2$, D$_2$, and N$_2$.

3. The method of claim 2, wherein the Si material used in the Si deposition process includes at least one of H$_2$, D$_2$, and N$_2$.

4. The method of claim 1, wherein the Si material used in the Si deposition process includes at least one of H$_2$, D$_2$, and N$_z$.

5. The method of claim 1, wherein the Si deposition process is performed in the Si material gas atmosphere including at least one of H$_2$, D$_2$, and N$_2$.

6. The method of claim 1, wherein a radio frequency (RF) bias is applied to the substrate in the reduction process.

7. The method of claim 6, wherein the RF bias is applied only in the reduction process in a pulse type.

8. The method of claim 6, wherein an RF range of the RF bias is from about 27 MHz to about 100 MHz.

* * * * *